(12) United States Patent
Ju

(10) Patent No.: US 7,422,450 B2
(45) Date of Patent: Sep. 9, 2008

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/521,445

(22) Filed: Sep. 15, 2006

(65) Prior Publication Data
US 2008/0070428 A1 Mar. 20, 2008

(51) Int. Cl.
*H01R 9/09* (2006.01)
(52) U.S. Cl. .......................................... 439/83; 439/331
(58) Field of Classification Search .................. 439/83, 439/330, 331, 342
See application file for complete search history.

(56) References Cited

U.S. PATENT DOCUMENTS

| | | | | |
|---|---|---|---|---|
| 6,042,412 | A * | 3/2000 | Murr | 439/331 |
| 6,220,884 | B1 * | 4/2001 | Lin | 439/342 |
| 6,482,050 | B1 * | 11/2002 | Lemke et al. | 439/856 |
| 6,914,192 | B2 * | 7/2005 | Ju | 174/94 R |
| 6,957,987 | B2 * | 10/2005 | Ma et al. | 439/733.1 |
| 7,097,470 | B2 * | 8/2006 | Harper, Jr. | 439/83 |
| 7,125,274 | B1 * | 10/2006 | Ju et al. | 439/342 |
| 2005/0026478 | A1 * | 2/2005 | Chiang | 439/83 |

* cited by examiner

*Primary Examiner*—Hien Vu
(74) *Attorney, Agent, or Firm*—Birch Stewart Kolasch & Birch, LLP

(57) ABSTRACT

The present invention provides an electrical connector for electrically connecting a circuit board. The electrical connector includes an insulative housing which has terminal-receiving holes, conductive terminals accommodated in the terminal-receiving holes, and a solder partially projected from a bottom of the insulative housing. Furthermore, each conductive terminal has conductive portion, and the solder is located under the conductive portion. When the electrical connector is soldered to the circuit board, the solder is melted, the conductive terminals and the insulative housing move downward, and part of the conductive portion can be inserted into the solder to form an electrical connection between the circuit board and the conductive terminals. Comparing with the prior art, the electrical connector of the invention can position the solder to contact with the conductive terminals, increase the co-planarity of the solder, and further raising the quality of the electrical connection.

8 Claims, 6 Drawing Sheets

ELECTRICAL CONNECTOR

BACKGROUND OF THE INVENTION

1. Field of the Invention

The present invention relates to an electrical connector, and more particularly, to an electrical connector for connecting a circuit board with a solder ball electrically.

2. Description of the Prior Art

Ball grid array (BGA) electrical connector has been widely applied in personal computers, for electrically connecting a chip module with a circuit board. A plurality of conductive terminals of the electrical connector are electrically connected to solder balls. Typically, each of the solder balls is positioned at each conductive terminal first, and then the solder balls are heated until they melt, so as to connect the conductive terminals to the circuit board. However, during the process, precise dimensions of the conductive terminals and the solder balls are highly required. This is to say, any deviation of the size of the conductive terminals or the solder balls may cause malposition, and then affect the co-planarity of the solder balls. When connecting the electrical connector to the circuit board, poor co-planarity may cause some solder balls to lose electrical connection with the circuit board.

Accordingly, there is a need to design a new electrical connector to overcome the defects as described above.

SUMMARY OF THE INVENTION

An aspect of the present invention is to provide an electrical connector for overcoming the problems as described above. Furthermore, the electrical connector is capable of positioning a solder to contact with conductive terminals, thus increasing the co-planarity of the solder and further raising the quality of electrical connection.

In a preferred embodiment of the invention, an electrical connector for electrically connecting a circuit board is provided. The electrical connector includes an insulative housing which has a plurality of terminal-receiving holes, a plurality of conductive terminals accommodated in the terminal-receiving holes, and a solder partially projected from the bottom of the insulative housing. Furthermore, each of the conductive terminals has a conductive portion, and the solder is located under the conductive portion. When the electrical connector is soldered to the circuit board, the solder melted, the conductive terminals and the insulative housing move downward, and part of the conductive portion is capable of inserting into the solder to form an electrical connection between the circuit board and the conductive terminals.

Comparing with the prior art, the electrical connector of the present invention is capable of effectively positioning the solder to contact with the conductive terminals and increasing the co-planarity of the solder, and further raising the quality of electrical connection.

The scope of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

Figure 6:
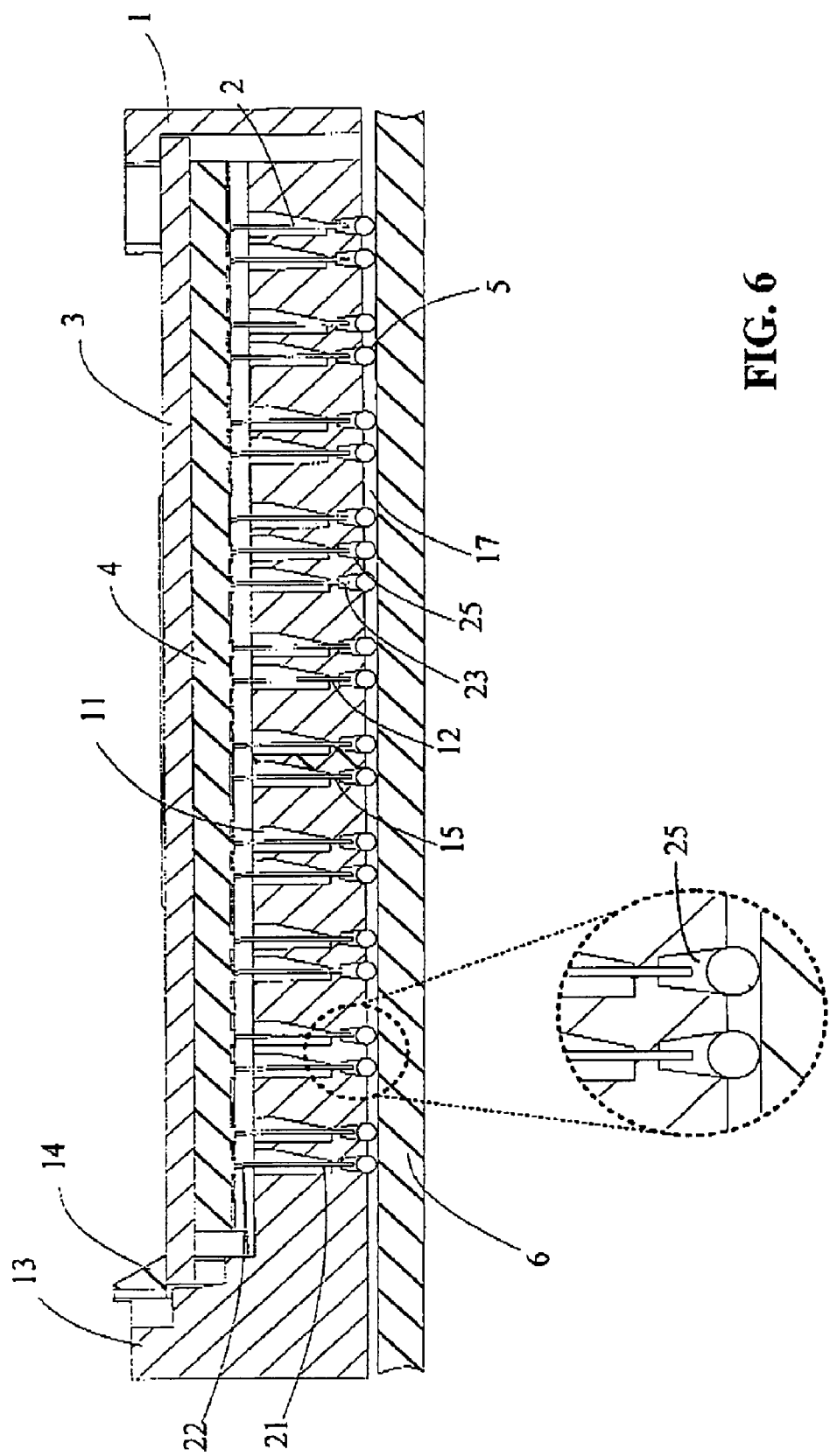
FIG. 6 shows an inner wall of the solder-containing hole having a vertical surface, or at least one inner wall of the solder-containing hole having an inclined surface.

Please refer to FIG. 1 to FIG. 4. The electrical connector of the present invention is applied to connect a chip module 4 with a circuit board 6. The electrical connector includes an insulative housing 1, a plurality of conductive terminals 2 accommodated in the insulative housing 1, a cap 3, and solder 5. The insulative housing 1 has a plurality of terminal-receiving holes for accommodating the plurality of conductive terminals 2. Furthermore, each of the terminal-receiving holes has clip portions 15 for holding the conductive terminals 2. Moreover, the bottom of the terminal-receiving holes as described above can hold the solder 5. The solder 5 is located under the conductive terminals 2; when the electrical connector is soldered to the circuit board 6, the solder 5 is melted, the conductive terminals 2 and the insulative housing 1 move downward, and part of the conductive portion is capable of inserting into the solder 5 to form a electrical connection between the circuit board 6 and the conductive terminals 2. Furthermore, each of the terminal-receiving holes can include a terminal-receiving space 11, a terminal-holding space 12, and a solder-containing space 25. The solder-containing space can be a solder-containing hole, and the solder 5 is movably accommodated in the solder-containing hole. Furthermore, the inner wall of the solder-containing hole can have a vertical surface, or at least one inner wall of the solder-containing hole has an inclined surface as shown in FIG. 6. In the embodiment, the solder 5 is a solder ball. Additionally, two side walls 13 of the insulative housing 1 extend upward, and one of the side walls 13 has a clasp 14 for holding the chip module 4 in the electrical connector.

Figure 1:
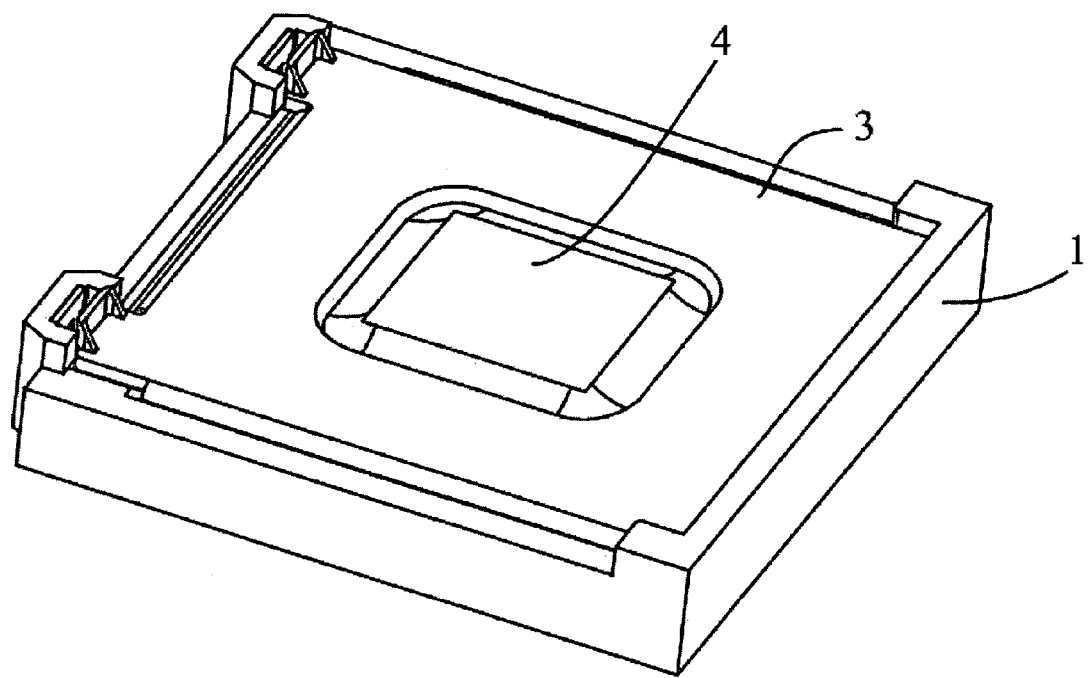
FIG. 1 is an assembly drawing of the electrical connector of the present invention.
Figure 2:
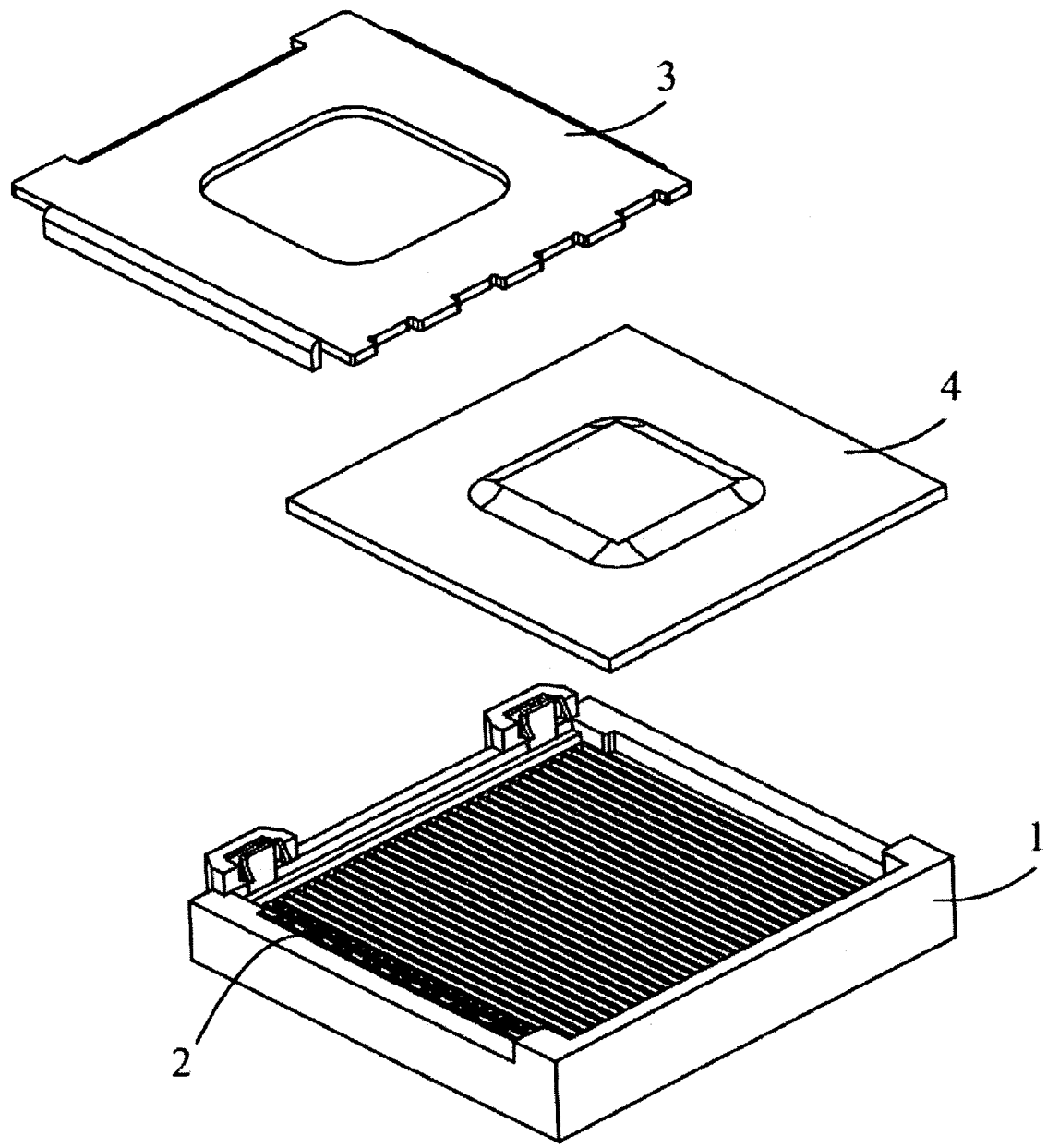
FIG. 2 is an explosive view of the electrical connector of the present invention.
Figure 3:
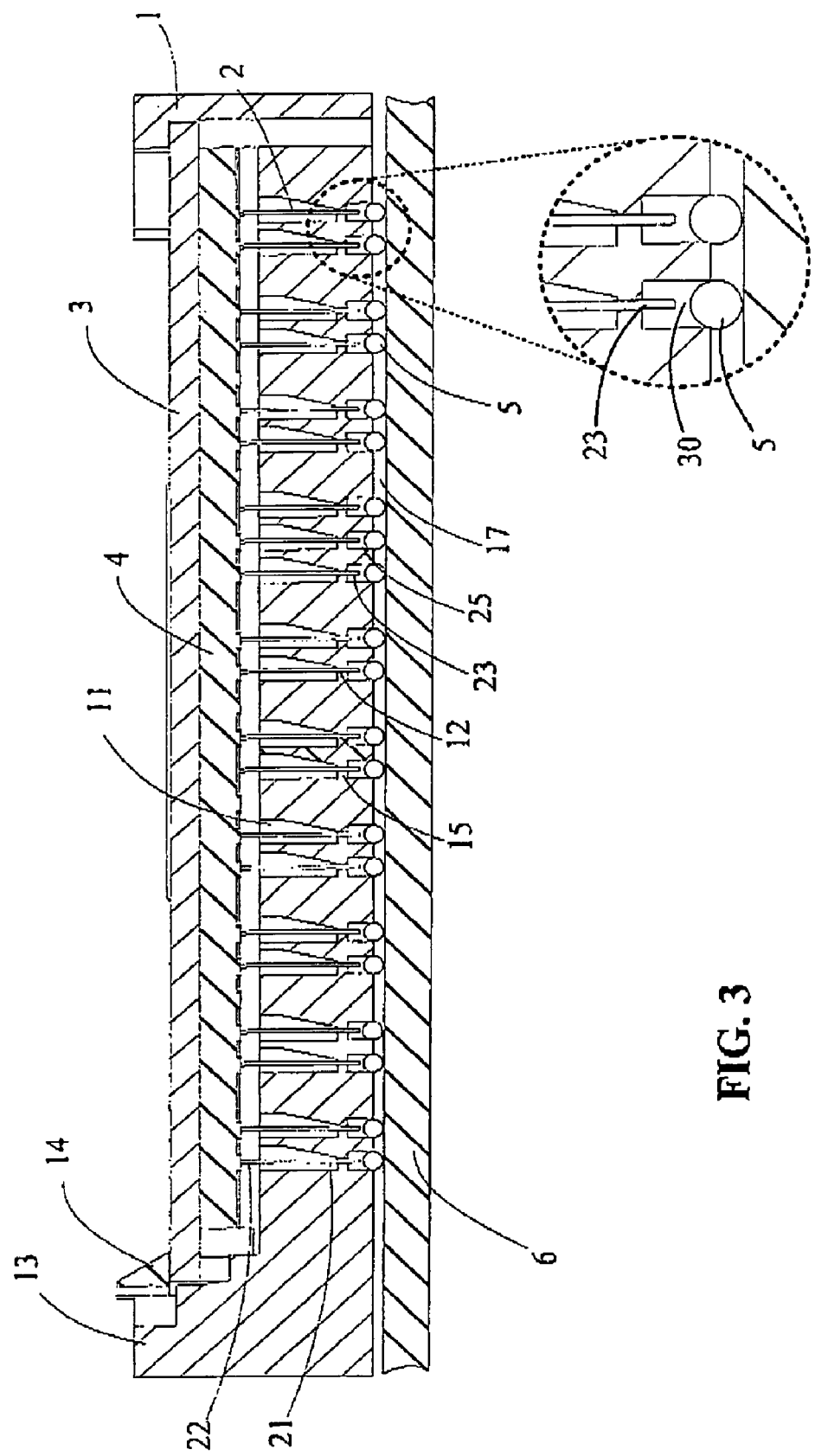
FIG. 3 is a sectional view of the electrical connector of the present invention.
Figure 4:
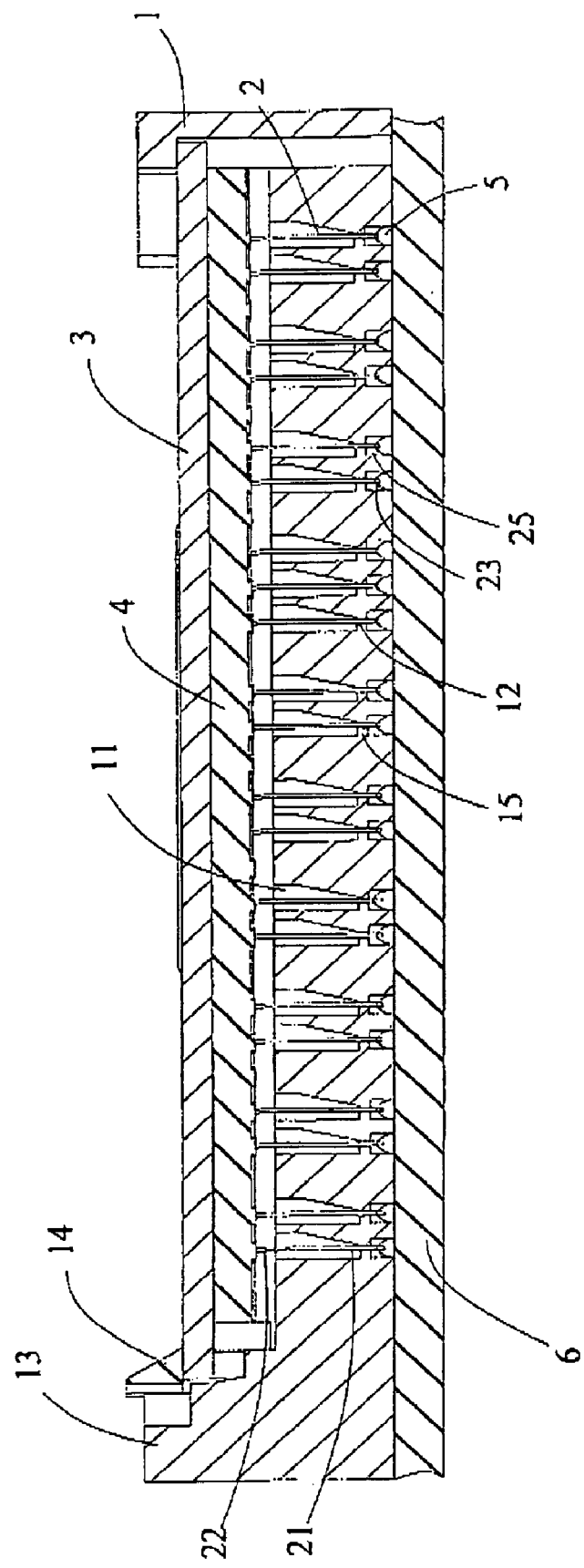
FIG. 4 is a sectional view of the electrical connector of the present invention.
Figure 5:
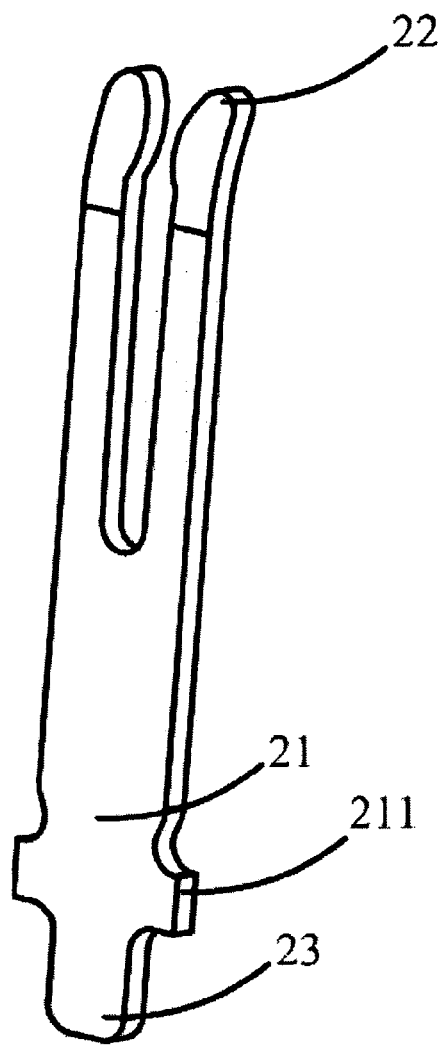
FIG. 5 shows the conductive terminal of the present invention.

Please refer to FIG. 5. Each of the conductive terminals includes a positioning portion 21, a pair of contact portion 22 with a fork-shape, and a conductive portion 23. The pair of contact portion 22 is formed by extending upward from the positioning portion 21. Furthermore, the conductive portion 23 is formed by extending downward from the positioning portion 21. Additionally, as shown in FIG. 3, a gap 30 exists between the conductive portion 23 and the solder 5; this is to say, before the solder 5 is melted, the conductive portion 23 does not connect with the solder. Furthermore, both sides of the positioning portion 21 protrude to form two interference portions 211, and the positioning portion 21 can be held by the clip portion 15 of the insulative housing 1.

When the chip module 4 is disposed in the electrical connector, the cap 3 is then disposed over the chip module 4, and the side wall 13 of the insulative housing 1 has a clasp 14 for clasping the cap 3 in a snap. Accordingly, the chip module 4 is firmly fixed within the electrical connector. When the solder 5 is positioned on the insulative housing 1, a gap 17 for the collapse of the solder 5 exists between the insulative housing 1 and the circuit board 6. Furthermore, the formation of the gap 17 can position the solder ball to contact with the conductive terminals 2, increase the co-planarity of the solder ball, and further raise the quality of electrical connection. The solder is located under the conductive portion 23 of the conductive terminals 2, and when the electrical connector is soldered with the circuit board 6, the solder 5 is melted, the conductive terminals 2 and the insulative housing 1 move down, and part of the conductive portion is capable of inserting into the solder 5 to form a electrical connection between the circuit board 6 and the conductive terminals 2. The electrical connection described above ensures good signal transmission quality of the conductive terminals 2.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and mounteds of the appended claims.

What is claimed is:

1. An electrical connector for electrically connecting a circuit board, comprising:
   an insulative housing having a plurality of terminal-receiving holes;
   a plurality of conductive terminals accommodated in the terminal-receiving holes; and
   a solder partially projected from a bottom of the insulative housing;
   wherein each of the conductive terminals has a conductive portion, and said solder is located under the conductive portion, the conductive portion does not connect the solder, a first gap exists in the insulative housing and between the solder and the conductive portion, when the electrical connector is soldered to the circuit board, the solder is melted, the conductive terminals and the insulative housing move downward, and part of the conductive portion is capable of inserting into the solder to form an electrical connection between the circuit board and the conductive terminals;
   wherein the electrical connector further comprising a cap having projections extending from an end thereof for repressing a chip module; and
   wherein a side wall of the insulative housing has clasps therealong for clasping the projections of the cap in a snap.

2. The electrical connector of claim 1, wherein an inner wall of each terminal-receiving hole has a clip portion for holding each of the conductive terminals.

3. The electrical connector of claim 1, wherein the conductive terminals further comprise a positioning portion, and the conductive portion is formed by extending downward from the positioning portion.

4. The electrical connector of claim 3, wherein the conductive terminals further comprise a pair of contact portion with fork-shape formed by extending upward from the positioning portion.

5. The electrical connector of claim 1, wherein the solder is a solder ball.

6. The electrical connector of claim 1, wherein a second gap for the collapse of the solder exists between the insulative housing and the circuit board.

7. The electrical connector of claim 1, wherein the solder-containing space is a solder-containing hole, and at least one inner wall of the solder-containing hole has an inclined surface, and the solder is movably accommodated therein.

8. An electrical connector for electrically connecting a circuit board, comprising:
   an insulative housing;
   a plurality of conductive terminals; and
   a solder partially projected from a bottom of the insulative housing;
   wherein the insulative housing has a terminal-receiving space, a terminal-holding space, and a solder-containing space;
   wherein each the conductive terminals has a conductive portion, and the solder is disposed under the conductive portion, the conductive portion does not connect the solder, a gap exists in the insulative housing and between the solder and the conductive portion;
   when the electrical connector is soldered to the circuit board, the solder is melted, the conductive terminals and the insulative housing move downward, and part of the conductive portion is capable of inserting into the solder to form an electrical connection between the circuit board and the conductive terminals;
   wherein the electrical connector further comprises a cap having projections extending from an end thereof for repressing a chip module; and
   wherein a side wall of the insulative housing has clasps therealong for clasping the projections of the cap in a snap.

* * * * *